US00RE40053E

(19) United States
(12) Reissued Patent
Eto

(10) Patent Number: US RE40,053 E
(45) Date of Reissued Patent: Feb. 12, 2008

(54) DELAY CIRCUIT HAVING DELAY TIME ADJUSTABLE BY CURRENT

(75) Inventor: Satoshi Eto, Kawasaki (JP)

(73) Assignee: Fujitsu Limited, Kawasaki (JP)

(21) Appl. No.: 11/106,733

(22) Filed: Apr. 15, 2005

Related U.S. Patent Documents

Reissue of:
(64) Patent No.: 6,657,473
Issued: Dec. 2, 2003
Appl. No.: 09/655,473
Filed: Sep. 5, 2000

(30) Foreign Application Priority Data

Jan. 31, 2000 (JP) ..... 2000-023038
Aug. 1, 2000 (JP) ..... 2000-233483

(51) Int. Cl.
*H03K 17/296* (2006.01)

(52) U.S. Cl. ..... 327/393; 327/392; 327/394; 327/395; 327/396; 327/397; 327/398; 327/399; 327/400; 327/401; 327/402

(58) Field of Classification Search ..... None
See application file for complete search history.

(56) References Cited

U.S. PATENT DOCUMENTS 5,063,311 A * 11/1991 Swapp ..... 327/278
5,334,891 A * 8/1994 Marbot ..... 327/281
5,355,038 A * 10/1994 Hui ..... 327/277
5,463,343 A * 10/1995 Marbot ..... 327/270
5,506,534 A * 4/1996 Guo et al. ..... 327/276
5,689,460 A 11/1997 Ooishi ..... 514/25
5,881,014 A 3/1999 Ooishi ..... 365/226
6,040,724 A * 3/2000 Kamiya ..... 327/170
6,072,742 A 6/2000 Ooishi ..... 365/226
6,133,773 A * 10/2000 Garlepp et al. ..... 327/247
6,166,576 A * 12/2000 Stave ..... 327/266
6,262,616 B1 * 7/2001 Srinivasan et al. ..... 327/264
6,348,827 B1 * 2/2002 Fifield et al. ..... 327/278
6,424,585 B1 7/2002 Ooishi ..... 365/226
6,573,777 B2 * 6/2003 Saint-Laurent et al. ..... 327/276

FOREIGN PATENT DOCUMENTS

JP 62-120725 6/1987
JP 08-190437 7/1996
JP 09-284125 10/1997

* cited by examiner

*Primary Examiner*—Tuan T. Lam
*Assistant Examiner*—Hiep Nguyen
(74) *Attorney, Agent, or Firm*—Arent Fox PLLC

(57) ABSTRACT

A delay circuit includes a delay part delaying a signal by a delay time which can be varied based on a control current, and a control current adjustment circuit adjusting the control current so that the delay time changes linearly based on a variation in a resistance value.

11 Claims, 9 Drawing Sheets

10
I
13
14
V2
Nr
25
24
Q1
I
pcon
26
Vss
23
Op.
-
+
V1
Nr
21
22
IO
Vss
R
20

FIG. 11
Amended
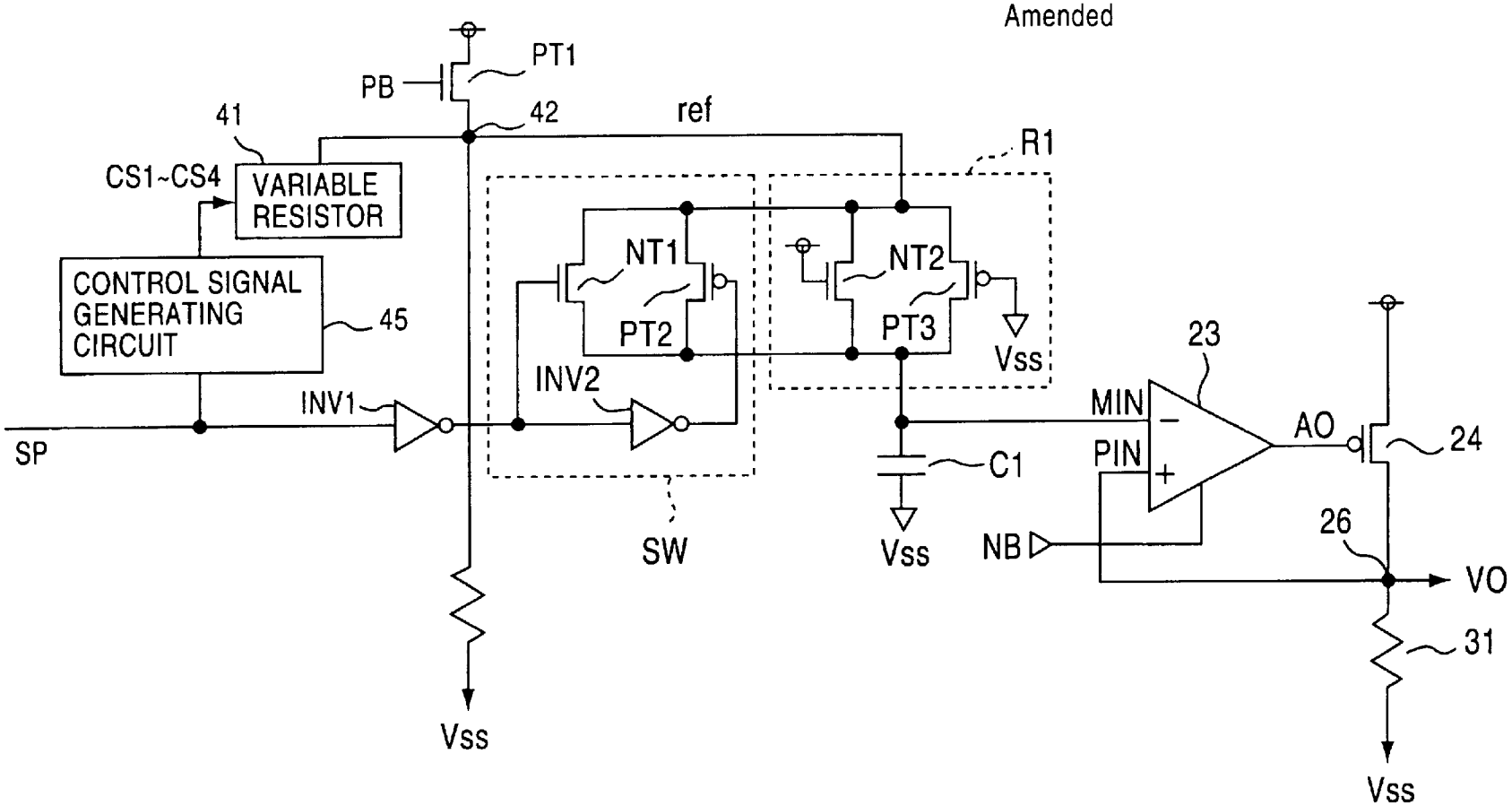

DELAY CIRCUIT HAVING DELAY TIME ADJUSTABLE BY CURRENT

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention generally relates to a delay circuit, and a semiconductor device and semiconductor integrated circuit equipped with the delay circuit. More particularly, the present invention is concerned with a delay circuit having a delay time that can be adjusted by a control current, and a semiconductor device and a semiconductor integrated circuit equipped with such a delay circuit.

2. Description of the Related Art

Generally, semiconductor devices are required to accurately operate over a wide frequency range. Generally, the semiconductor devices are equipped with a delay circuit that adjusts the timing relationship among internal signals or the timing relationship between an external clock and an internal clock. Such a delay circuit is required to delay a signal over a wide frequency range with a high precision.

Conventionally, the delay circuit includes logic circuits connected in series, each logic circuit being made up of logic gates such as an inverter and a NAND gate. Each of the logic circuits acts to delay a signal applied to the delay circuit. The delay [of] time depends on the number of cascaded logic circuits through which the input signal serially passes. That is, the delay time can be adjusted by changing the number of logic circuits (the number of stages) through which the input signal serially passes. Thus, the delay time is proportional to the number of logic circuits through which the input signal serially passes.

The minimum adjustable delay time is equal to the delay time of one logic circuit or delay stage. In other words, the minimum precision of the delay circuit depends on the delay time of one logic circuit. Thus, it is impossible to more finely adjust the delay time than the precision of each logic circuit.

There is a demand for a delay circuit capable of delaying a signal over a wide frequency range with high precision in order to realize fine adjustment of the timing relationship among the internal signals of the semiconductor device and the timing relationship between the external and internal clocks.

There is another demand as described below. There are semiconductor integrated circuits equipped with a circuit that internally generates a reference voltage. A transient noise may be superimposed on the reference voltage. Such a transient noise prevents the semiconductor integrated circuit from operating in a stable state. Hence, it is required to avoid an influence of the transient noise.

For example, a low-pass filter is provided between a reference voltage generating circuit and a circuit which utilizes a reference voltage generated by the reference voltage generating circuit. The low-pass filter smoothes the transient noise. However, there is a disadvantage in that the low-pass filter degrades [responsibility] *the response* to a change of the reference voltage. Thus, the use of the low-pass filter is not adequate for a situation in which the reference voltage changes. That is, the conventional semiconductor integrated circuit does not have any effective means for filtering the transient noise superimposed on the reference signal that changes.

SUMMARY OF THE INVENTION

It is a general object of the present invention to eliminate the above disadvantages.

A more specific object of the present invention is to provide a delay circuit capable of adjusting a signal over a wide frequency range with high precision so that the timing relationship between signals can be finely adjusted and to provide a semiconductor device equipped with such a delay circuit.

The above objects of the present invention are achieved by a delay circuit comprising: a delay part delaying a signal by a delay time which can be varied based on a control current; and a control current adjustment circuit adjusting the control current so that the delay time changes linearly based on a variation in a resistance value.

Another object of the present invention is to provide a semiconductor integrated circuit capable of operating in a stable state in a situation in which a transient noise is superimposed on a reference voltage that is generated in the semiconductor integrated circuit.

BRIEF DESCRIPTION OF THE DRAWINGS

Other objects, features and advantages of the present invention will become more apparent from the following detailed description when read in conjunction with the accompanying drawings, in which:

FIG. 11 is a circuit digram of a detailed configuration of the semiconductor integrated circuit shown in FIG. 8;

DESCRIPTION OF THE PREFERRED EMBODIMENTS

Figure 1:
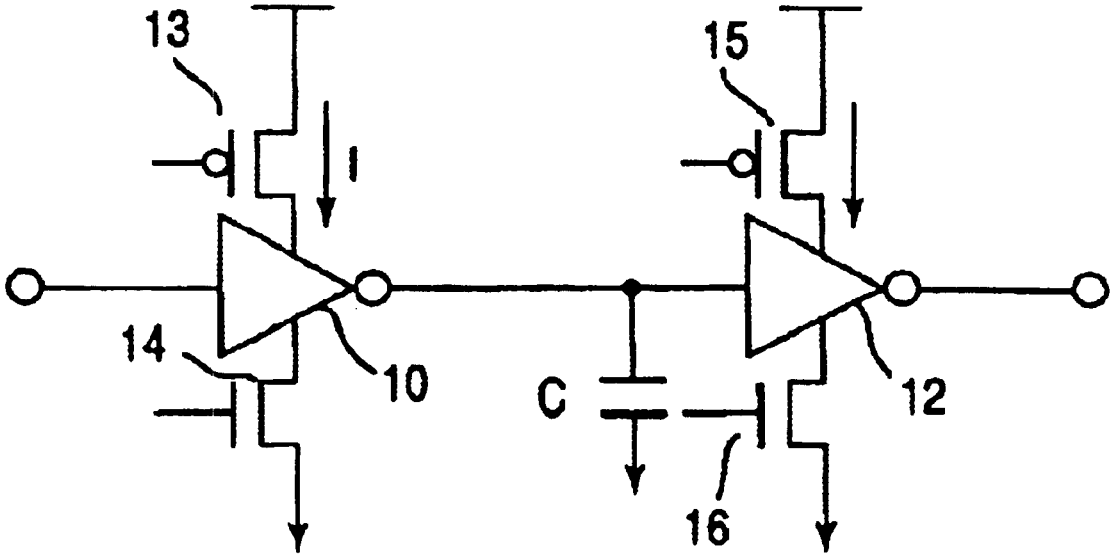
FIG. 1 is a circuit diagram illustrating the principle of a delay circuit of the present invention.

A description will be given of embodiments of the present invention with reference to the accompanying drawings.

First, the principle of the present invention will be described by referring to FIG. 1. The delay circuit shown in FIG. 1 adjusts a delay time td by adjusting a control current I supplied to an inversion circuit 10. An increase/decrease of the control [circuit] *current* I adjusts the time necessary to charge a load capacitance C of the next stage and thus adjust the time necessary for the signal input of the next stage to reach a logical threshold value. The current I flows through a P-channel MOS transistor 13, the inversion circuit 10, and an N-channel MOS transistor 14. Similarly, a current flows through a P-channel MOS transistor 15, an inversion circuit 12, and an N-channel MOS transistor 16. As will be described later, each of the inversion circuits 10 and 12 is a logic circuit that acts as a delay part made up of logic gates.

For example, the following equations can be described:

$$I0 \times td0 = C \times Vt \quad (1)$$

$$(I0 - \Delta f) \times (td0 + \Delta td) = C \times Vt \quad (2)$$

where td0 is a delay time for a control current I0, Δtd is a variation of the delay time when the control current I0 changes by ΔI, Vt is a logic threshold value of the delay circuits 10 and 12 shown in FIG. 1, and C is a load capacitance of the next stage following the delay circuit 10.

Equation (3) can be obtained from equations (1) and (2) as follows:

$$\Delta I = I0 \times \Delta td / (td0 + \Delta td) \quad (3)$$

Thus, the control current I for obtaining a desired delay time can be calculated by equation (4) described below:

$$I = I0 - \Delta I = I0 \times td0 / (td0 + \Delta td) \quad (4)$$

Thus, the desired delay time can be obtained by adjusting the control current I so that equation (4) is satisfied.

Now, a description will be described, with reference to FIG. 2, of a circuit capable of generating the current I which satisfies equation. (4).

First Embodiment

Figure 2:
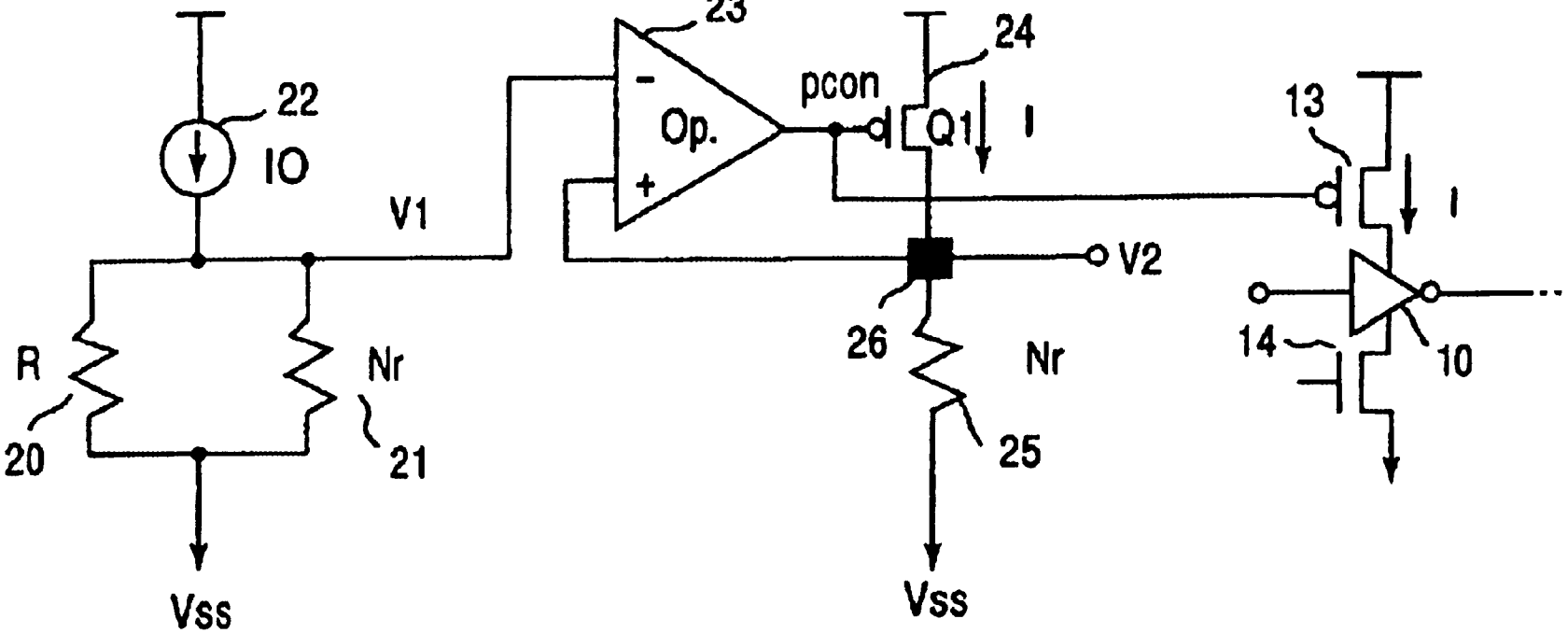
FIG. 2 is a circuit diagram of a delay circuit according to a first embodiment of the present invention.

FIG. 2 is a circuit diagram of a delay circuit according to a first embodiment of the present invention. The delay circuit shown in FIG. 2 includes a current source 22 having an output node, to which a fixed resistor 20, a variable resistor 21, and an inverting input terminal of an operational amplifier 23 acting as a comparator are connected. The resistor 20 has a resistance value R. The variable resistor 21 has a variable resistance value N×r where N is a natural number, and r is a constant. The resistor 20 and the variable resistor 21 are connected between the current source 22 and ground Vss in parallel.

A P-channel MOS transistor 24 has a source connected to a power supply, and a drain that is[,] connected to a non-inverting input terminal of the operational amplifier 23 and is grounded via a variable resistor 25. This variable resistor 25 has a resistance value N×r as in the case of the variable resistor 21. That is, the variable resistors 21 and 25 have the same resistance value Nr.

A voltage V applied to the non-inverting terminal of the operational amplifier 23 can be written as follows:

$$V = (R \times Nr)/(R + Nr) \times I0 \quad (5)$$

The voltage of a node 26 of the variable resistor 25 obtained in a state in which the other node thereof is connected to ground Vss is equal to the voltage V defined by equation (5). Thus, a current I flowing through the variable resistor 25 an be expressed as follows:

$$I = V/Nr = I0 \times R/(R + Nr) \quad (6)$$

It can be seen from comparison between equations (6) and (4) that R and Nr correspond to td0 and /Δtd, respectively. Thus, by adequately adjusting the values of R and r, it is possible to generate the control current I which linearly changes the delay time as the natural number N increases such that N=1, 2, 3,. . . .

For example, as shown in FIG. 2, when a gate voltage pcon of the P-channel MOS transistor 24 is applied to the gate of the P-channel MOS transistor 13 forming the current source of the inversion circuit 10 of current control type, it is possible to generate the control current I that linearly changes the delay time based on changes of the resistance values of the variable resistors 21 and 25.

In short, the current source 22 and the resistors 20 and 21 generates the voltage [V] *V1* based on the resistance value Nr. The operational amplifier 23 controls the P-channel MOS transistor 24 (Q1) generating the control current I on the basis of the voltages [V] *V1 and V2*.

Second Embodiment

Figure 3:
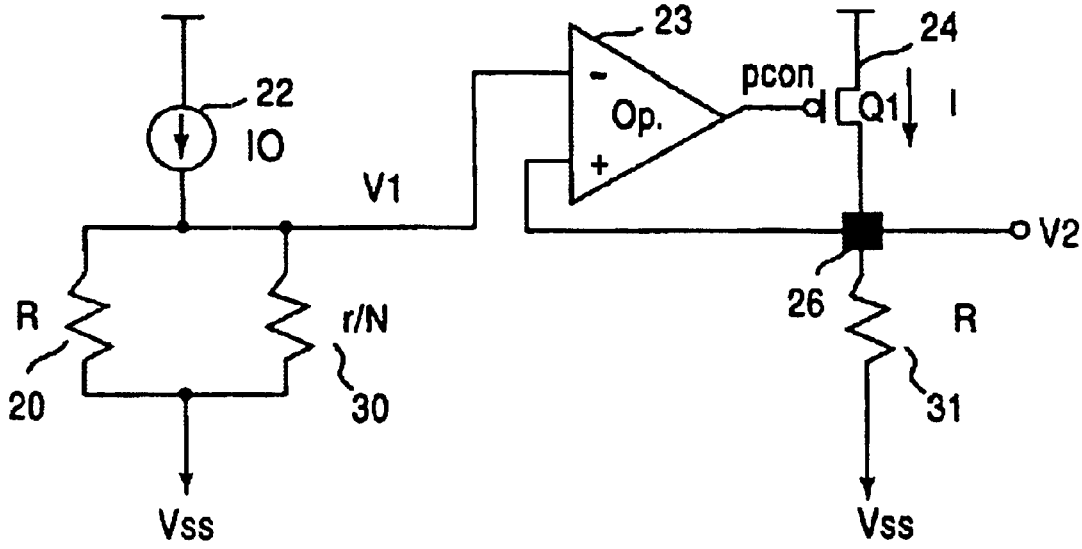
FIG. 3 is a circuit diagram of a delay circuit according to a second embodiment of the present invention.

FIG. 3 is a circuit diagram of a delay circuit according to a second embodiment of the present invention. Any part shown [in.] *in* FIG. 3 that is the same as a part shown in the previously described figures is denoted by the same reference numeral *used* in these figures.

As shown in FIG. 3, the output node of the current source 22 is connected to the resistor 20, a variable resistor 30, and the inserting input terminal of the operational amplifier 23. The variable resistor 30 has a variable resistance [value.] *value* described as r/N where N is a natural number and r is a [constants] *constant.* The resistor 20 and the variable resistor 30 are connected between the current source 22 and the ground Vss in parallel.

The source of the P-channel MOS transistor 24 is connected to the power supply, and the drain thereof is connected to the non-inverting input terminal of the operational amplifier 23 and is grounded via a fixed resistor 31, which has a resistance value R.

The voltage V applied to the [inverting] *non-inverting* input terminal of the operational amplifier 23 can be expressed as follows:

$$V = (R \times r/N)/(R + (r/N)) \times I0 \quad (7)$$

The voltage of the node 26 of the resistor 31 obtained when the other node thereof is connected to the ground Vss is equal to the voltage V defined by equation (7). Thus, a current I flowing through the resistor 31 can be written as follows:

$$I = V/R = I0 \times r/(NR + r) \quad (8)$$

It can be seen from comparison between equations (8) and (4) that r and NR correspond to td0 and Δtd, respectively. Thus, by adequately adjusting the resistance values of R and r, it is possible to generate the control current I which linearly changes the [delay.time] *delay time* as the natural number N increases such that N=1, 2, 3,. . . .

Thus, as in the case of the first embodiment of the present invention, when the gate voltage pcon of the P-channel MOS transistor 24 is to the gate of the P-channel MOS transistor 13 (not shown in FIG. 3) forming the current source of the inversion circuit 10 of current control type, it is possible to generate the control current I that linearly changes the delay time based on a change of the resistance value of the variable resistor 30.

Figure 4:
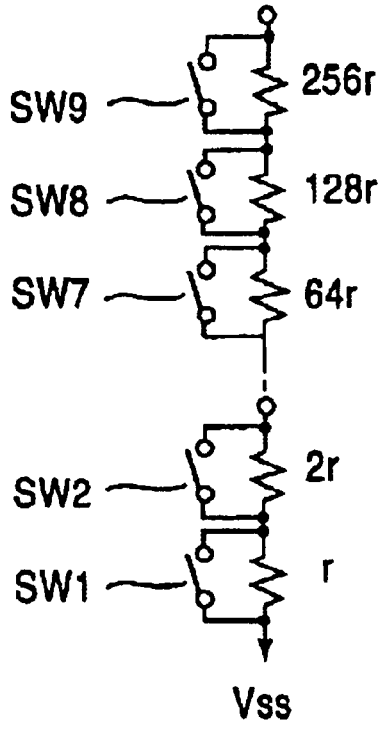
FIG. 4 is a circuit diagram of an example of a variable resistor which can be used in the embodiments of the present invention.
Figure 5:
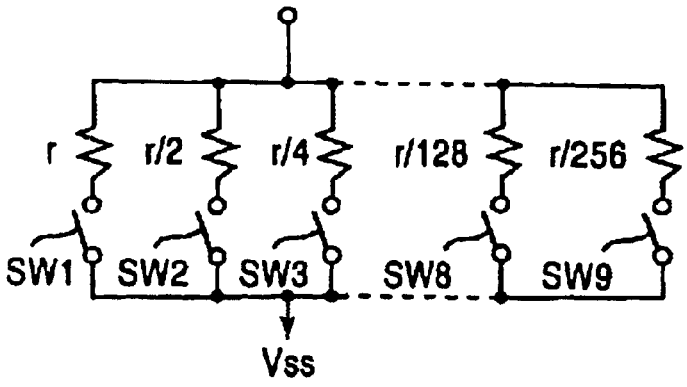
FIG. 5 is a circuit diagram of another example of the variable resistor which can be used in the embodiments of the present invention.

A description will be given, with reference.to FIGS. 4 and 5 of examples of the variable resistors 21, 25 and 30. More particularly, FIG. 4 is a circuit diagram of a configuration of the variable resistors 21 and 25 having the same resistance value Nr, and FIG. 5 is a circuit diagram of the variable resistor 30 having the resistance value r/N. In the circuits shown in FIGS. 4 and 5, it is assumed that r has an arbitrary value.

The variable resistor shown in FIG. 4 includes resistors $2^{n-1}$×r: (n=1~9) connected in series, and switches SW1 through SW9 respectively connected in parallel with the resistors. The variable resistor is capable of generating a resistance value between r and $(2^n-1)$r by combinations of ON/OFF of the switches SW1-SW9. The number n is not limited to the example of n=1~9 shown in FIG. 4.

The variable resistor shown in FIG. 5 includes resistors $r/2^{n-1}$ (:n=1~9), and switches SW1 through SW9 respectively connected in series with the resistors. The series circuits thus configured are connected in parallel between the power supply and ground. The variable resistor is capable of generating a resistance value between r and $r/(2^n-1)$ by combinations of ON/OFF of the witches SW1-SW9. The number n is not limited to he example of n=1~9 shown in FIG. 5.

The configuration in FIG. 4 has n different resistors having the resistance values $2^{n-1}$×r. Alternatively, the variable resistor may employ resistors having resistance values $2^{k-1}$×r and resistors having resistance values of $2^k$×r where k is an integer. The variable resistor shown in FIG. 5 may be modified so as to have alternative resistors as described above.

Figure 6:
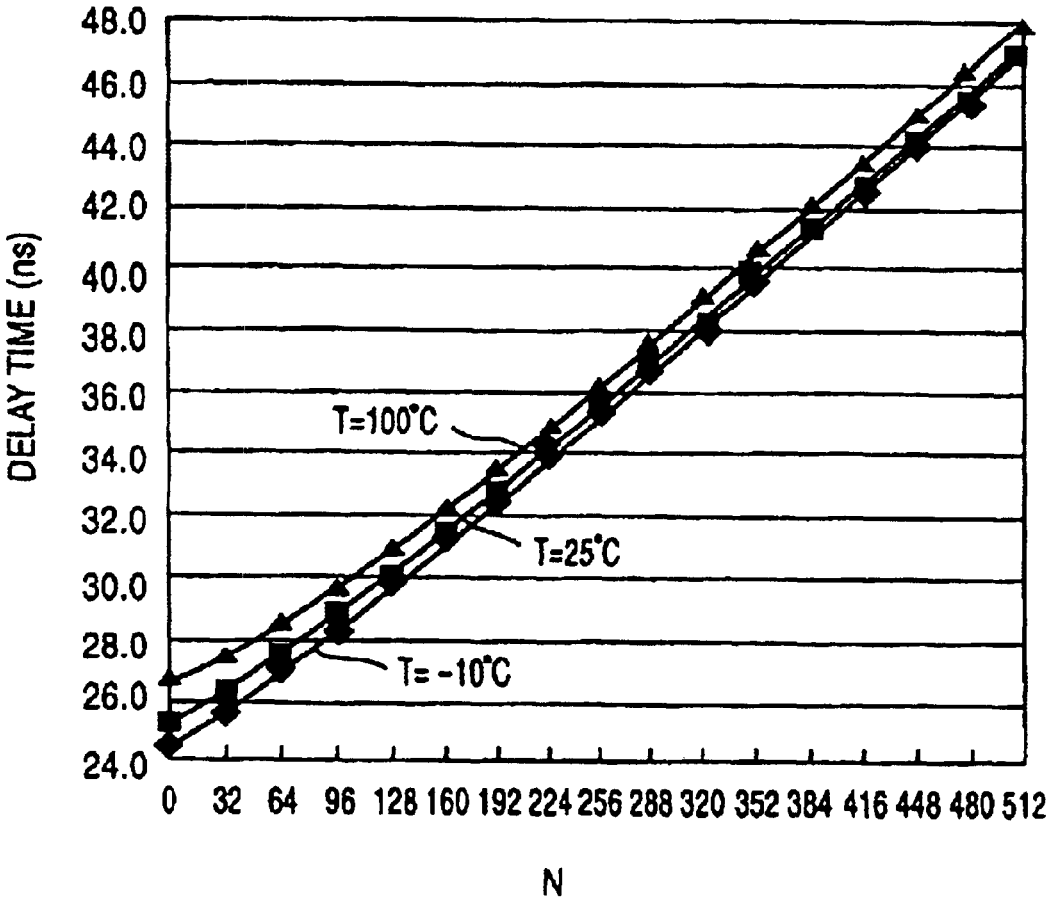
FIG. 6 is a graph of a relationship between the delay time and a parameter N related to the variable resistor.

When the delay time of the delay circuit including cascaded inversion circuits of current control type is controlled by the control current generated by utilizing the circuit shown FIG. 3, the relationship between the natural number N and the delay time is as illustrated in FIG. 6, which shows delay times (ns) for N=0~511. It can be seen from FIG. 6 that the delay time changes linearly as N increases. In this case., the delay time can be adjusted as precisely as approximately 40 ps (=20 ns/512). The precision can be further improved as the number N increases.

Third Embodiment

Figure 7:
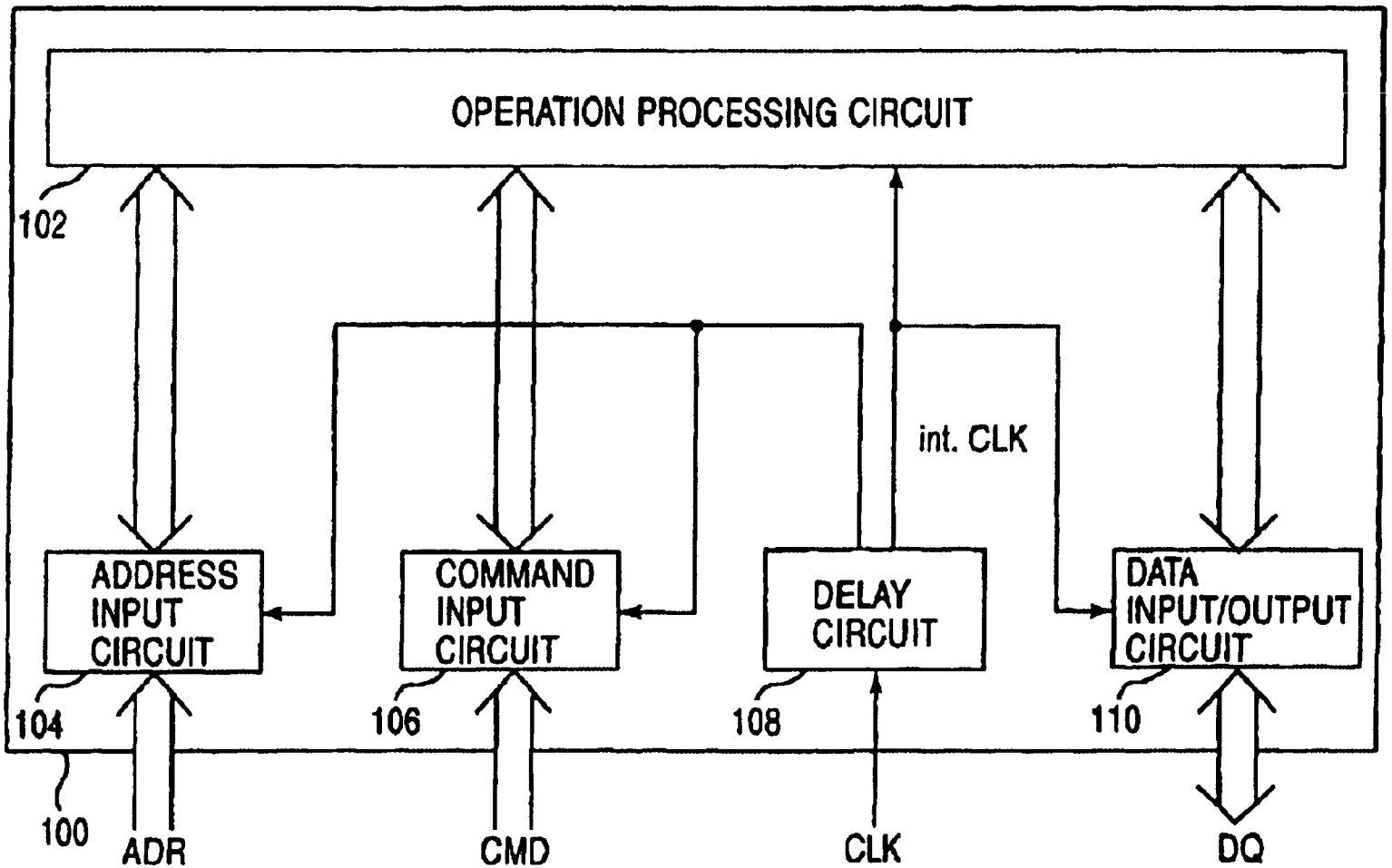
FIG. 7 is a block diagram of a semiconductor device equipped with the delay circuit according to a third embodiment of the present invention.

A description will be given, with reference to FIG. 7, of a [.semiconductor] *semiconductor* device 100 equipped with the above-mentioned delay circuit according to a third embodiment of the present invention.

The semiconductor device 100 includes an operation processing circuit 102, an address input circuit 104, a command input circuit 106, a delay circuit 108, and a data input/output circuit 110. The delay circuit 108 is supplied with an external clock CLK, and adjusts the timing relationship between the external clock CLK and an internal clock int.CLK utilized inside the semiconductor device 100.The delay circuit 108 generates the internal clock int.CLK by delaying the external clock CLK by the above-mentioned manner. The internal clock thus generated is supplied to parts of the semiconductor device 100.

The semiconductor device 100 equipped with the delay circuit 108 is capable of adjusting the timing relationship between the external and internal clocks over a wide frequency range with a high precision. The delay circuit of the present invention can be applied to another timing adjustment made in the semiconductor device. For example, the delay circuit of the present invention can be used to adjust the timing relationship between internal signals transmitted in the semiconductor device.

Fourth Embodiment

Figure 8:
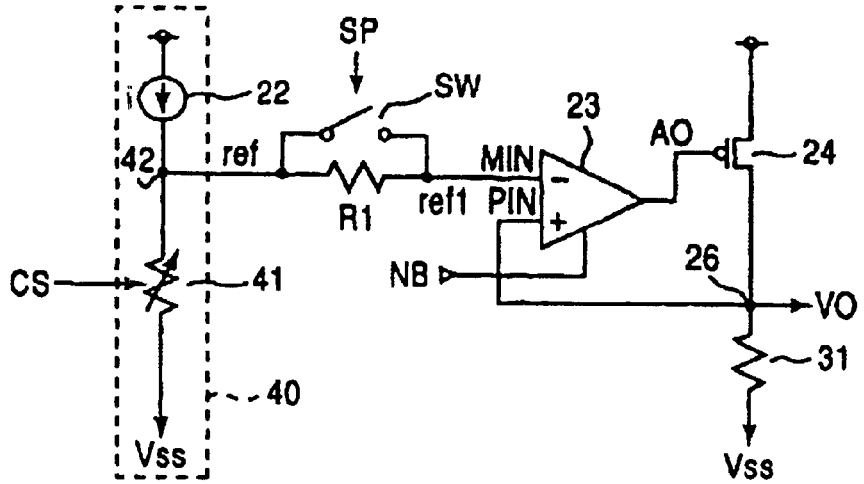
FIG. 8 is a circuit diagram of a semiconductor integrated circuit according to a fourth embodiment of the present invention.

FIG. 8 is a circuit diagram of a semiconductor integrated circuit according to a fourth embodiment of the present invention. The semiconductor integrated circuit shown in FIG. 8 is equipped with a reference voltage generating circuit 40, a switch SW and a resistor R1 in addition to the aforementioned operational amplifier 23, P-channel MOS transistor 24, node 26, and resistor 31. The reference voltage generating circuit 40 includes the current source 22 and a variable resistor 41 connected in series therewith, and a node 42 located between the current source 22 and the variable resistor 41.

The P-channel MOS transistor 24 and the resistor 31 are connected in series. The node 26 is located between the P-channel MOS transistor 24 and the resistor 31. The switch SW and the resistor R1 are connected between the node 42 and the inverting input terminal of the operational amplifier 23 in parallel. The output terminal of the operational amplifier 23 is [connected.to] *connected to* the gate of the P-channel MOS transistor 24. The non-inverting terminal of the operational amplifier 23 is connected to the node 26. The variable resistor 41 is supplied with a control signal CS, which determines the resistance value of the variable resistor 41. The variable resistor 41 has discrete resistance values controlled by the control signal CS. In other words, the resistance value of the variable resistor 41 can be changed in a stepwise fashion. The switch SW is turned ON and OFF by a switch signal SP. The operational amplifier 23 is supplied with a bias voltage NB.

An output voltage VO of the semiconductor integrated circuit is output via the node 26. The semiconductor integrated circuit thus configured operates as follows.

The reference voltage generating circuit 40 generates a reference voltage ref via the node 42 in accordance with the control signal CS supplied to the variable resistor 41. The inverting input terminal of the operational amplifier 23 is supplied with the reference voltage ref via the switch SW. Thus, an input signal MIN having a reference ref1 is applied to the inverting input terminal of the operational amplifier 23. An input signal PIN is supplied [with] *to* the non-inverting input terminal of the operational amplifier 23.

The operational amplifier 23, the P-channel MOS transistor 24, and the resistor 31 form a voltage regulator, which outputs the same output voltage VO as the reference voltage ref1 via the node 26. A signal AO is supplied to the gate of the P-channel MOS transistor 24 from the output node of the operational amplifier 23.

Figure 9:
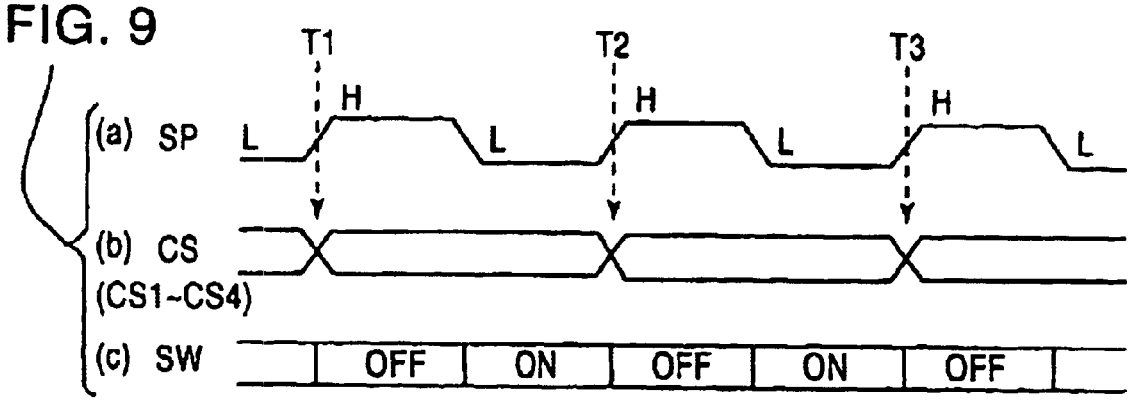
FIG. 9 is a timing chart of an operation of the semiconductor integrated circuit shown in FIG. 8.

As shown in part (b) of FIG. 9, it is assumed that the control signal CS supplied to the variable resistor 41 changes at times T1, T2 and T3. In this case, the switch signal SP supplied to the switch SW is a cyclic signal which rises from a low level to a high level at the times T1, T2 and T3, as shown in part (a) of FIG. 9. As shown in part (c) of FIG. 9, the switch SW is maintained in the OFF state as long as the control signal CS is at the high level, and is maintained in the ON state as long as the control signal.CS is at the low level.

Figure 10:
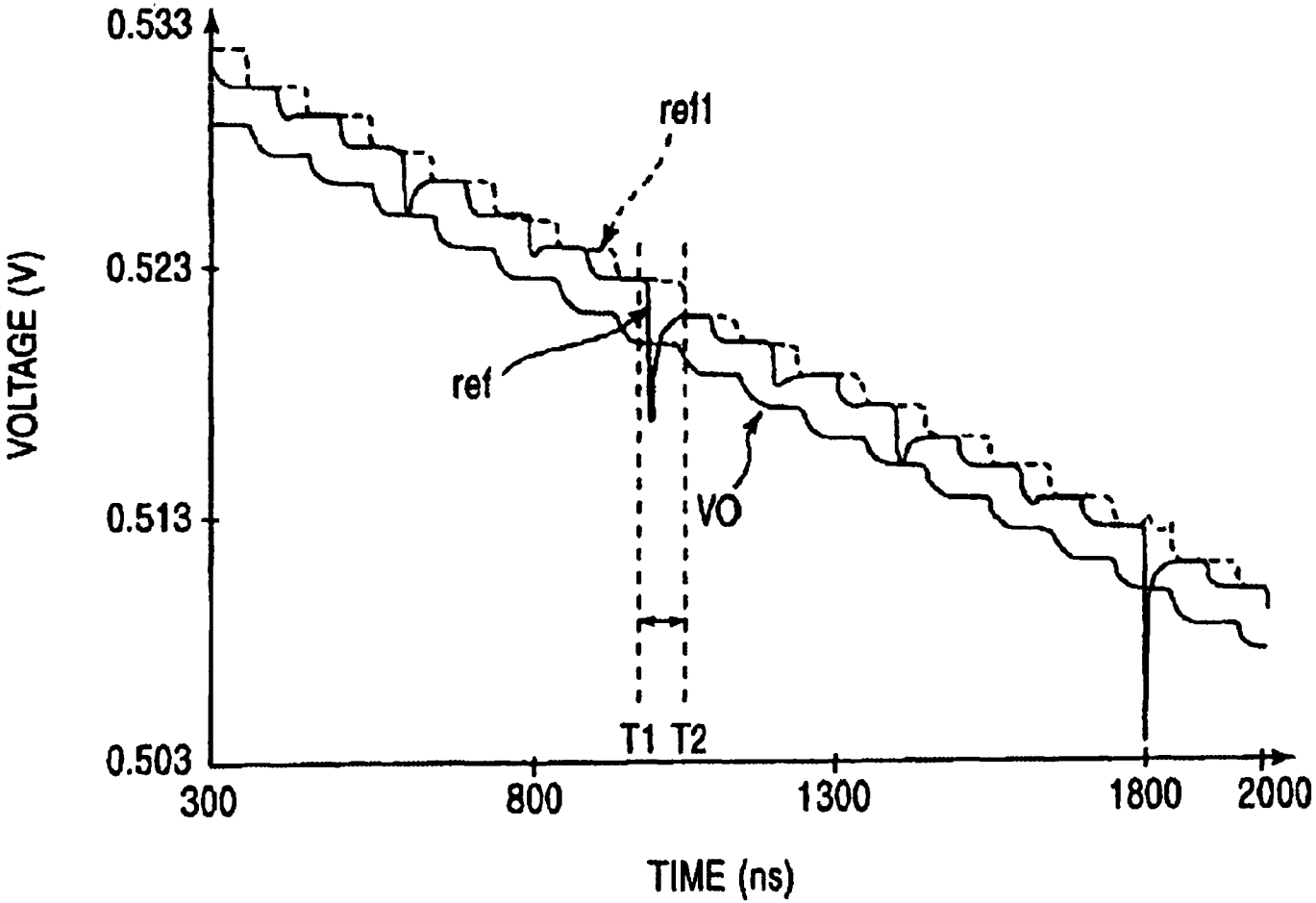
FIG. 10 is a graph of a relationship between the voltage and time obtained by simulating the operation of the semiconductor integrated circuit shown in FIG. 8.

FIG. 10 is a graph obtained by simulating the operation of the semiconductor integrated circuit shown in FIG. 8. The vertical axis of the graph of FIG. 10 denotes the voltage (V), and the horizontal axis thereof denotes time (ns). The graph shows that the reference voltage ref gradually decreases as the time passes.

It can be seen from the graph of FIG. 10 that a regular variation [(.noise)] (*noise*) of a spike shape may occur when the reference voltage ref steps down. More specifically, a spike noise occurs only for a short constant period after the reference voltage ref is changed in response to the control signal CS supplied to the variable resistor 41.

With the above simulation results in mind, the switch SW shown in FIG. 8 is turned OFF for a short period defined by, for example, the times T1 and T2, and is turned ON at the time T2 at which the reference voltage ref1 is already settled. When the switch SW turns ON, a direct connection is made between the inverting input terminal of the operational amplifier 23 and the node 42, so that the reference voltage ref1 becomes equal to the reference voltage ref.

By controlling the switch SW as described above, the reference voltage ref1 is controlled as illustrated by a broken line in FIG. 10. Thus, it is possible to prevent the spike noises from being superimposed on the reference voltage ref1. Since the inverting input terminal of the operational amplifier 23 and the node 42 are short-circuited except that period between the times T1 and T2, it is possible to prevent the operational amplifier 23 from being affected by the spike noises and to ensure good [responsibility] *response* of the operational amplifier 23 to the operation of the reference voltage generating circuit 40.

It will be noted [that] *in* FIG. 10 that the output voltage VO is not affected by the spike noises superimposed on the reference voltage at all.

FIG. 11 is a circuit diagram of a more detailed example of the semiconductor integrated circuit shown in FIG. 8. Referring to FIG. 11, the current source 22 shown in FIG. 8 includes a P-channel MOS transistor PT1, which is supplied with a bias voltage PB via the gate thereof. The switch SW is made up of an inversion circuit INV2, and an N-channel MOS transistor NT1 and a P-channel MOS transistor PT2 connected in parallel. The resistor [Ri] *R1* shown in FIG. 8 is made up of an N-channel MOS resistor NT2 and a P-channel MOS transistor PT3 connected in parallel.

The semiconductor integrated circuit shown in FIG. 11 is further equipped with a control signal generating circuit 45, which generates control signals CS1-CS4 in accordance with the switch signal SP. The control signal CS1-CS4 thus generated are supplied to the variable resistor 41. The switch signal SP is supplied, via the inversion circuit INV1, to the gate of the N-channel MOS transistor NT1 and the inversion circuit INV2. The semiconductor integrated circuit shown in FIG. 11 is further equipped with a capacitance element C1 connected between the inverting input terminal of the operational amplifier 23 and the ground node.

Figure 12:
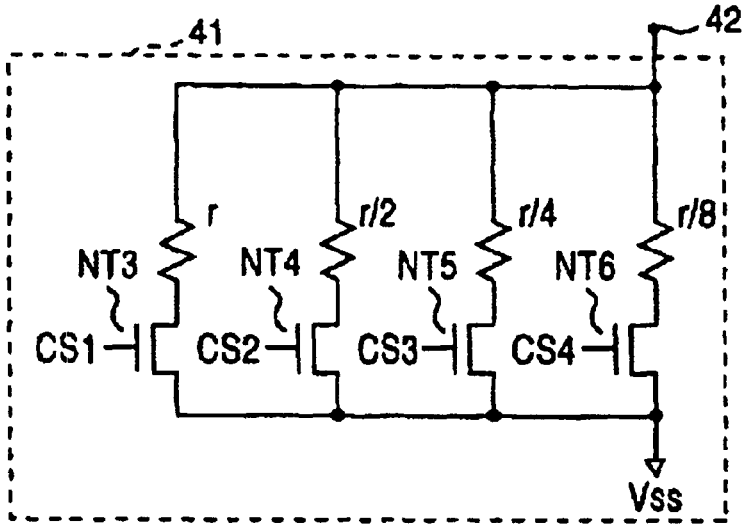
FIG. 12 is a circuit diagram of a configuration of a variable resistor shown in FIG. 11.

FIG. 12 is a circuit diagram of an example of the variable resistor 41 shown in FIG. 11. The variable resistor 41 includes resistors that are connected between the node 42 and the ground node in parallel and have respective resistance values r, r/2, r/4 and r/8. Further, the variable resistor 41 includes N-channel MOS transistors NT3-NT6, which are connected in series to the respective resistors. The gates of the N-channel MOS transistors NT3-NT6 receive the control signals CS1-CS4, respectively.

Figure 13:
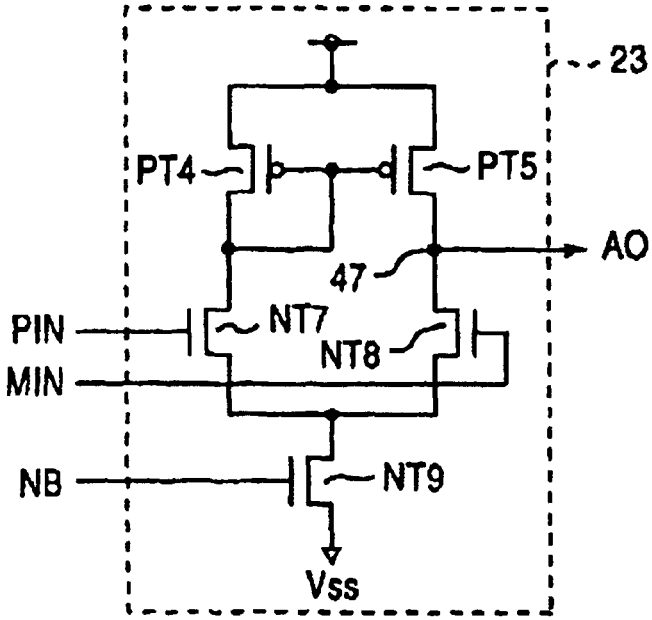
FIG. 13 is a circuit diagram of a configuration of an operational amplifier shown in FIG. 11.

FIG. 13 is a circuit diagram of an example of the operational amplifier 23 shown in FIG. 11.

As shown in FIG. 13, the operational amplifier 23 includes N-channel MOS transistors NT7-NT9, and a current-mirror circuit made up of P-channel MOS transistors PT4 and PT5. The input signal PIN is supplied to the gate of the N-channel MOS transistor NT7, and the input signal MIN is supplied to the gate of the N-channel MOS transistor NT8. The bias voltage NB is applied to the gate of the N-channel MOS transistor NT9. The signal AO is output via an output node [43] *47*.

The semiconductor integrated circuit thus configured operates as follows.

The control signal generating circuit 45 generates control signals CS1-CS4, which [changes] *change* at the times (T1, T2 and T3) at which the switch signal SP changes from the low level to the high level, as shown in parts (a) and (b) of FIG. 9.

The variable resistor 41 is set so as to have a desired resistance value by supplying the control signals CS1-CS4 to the gates of the N-channel MOS transistors NT3-NT6, respectively. The switch signal SP is supplied to the switch SW. While the switch signal SP is at the high level, the N-channel MOS transistor NT1 and the P-channel MOS transistor PT2 shown in FIG. 11 are both OFF. In [contrary] *contrast*, when the switch signal SP is at the low level, the transistors NT1 and PT2 are both ON.

Thus, it is possible to *eliminate* a transient noise which occurs when the new resistance value is set in the variable resistor 41 from being transmitted to the operational amplifier 23. Therefore, the switch SW causes the resistor R1 to act as a filter that eliminates noise. The resistor R1 acts as a potential hold circuit for holding the reference voltage to be supplied to the operational amplifier 23.

In actuality, the switch SW is turned OFF immediately before the reference voltage ref changes because it takes a certain time for the reference voltage ref output via the node 42 to change after the control signals CS1-CS4 are supplied to the variable resistor 41.

Further, the resistor R1 acts to avoid the floating state of the input nodes of the operational amplifier 23 during the period when the switch SW is OFF.

According to the present invention, it is possible to avoid influence of noise, that occurs when the reference voltage ref changes, without providing a low-pass filter between the reference voltage generating circuit 40 and the operational amplifier 23 [which refers to the reference voltage ref generated by the circuit 40]. Thus, it is possible to realize highly precise and stable control of the semiconductor integrated circuit without degrading the [responsibility] *response*.

The present invention is not limited to the specifically disclosed embodiments, and variations and modifications may be made without departing from the scope of the invention.

What is claimed is:

1. A delay circuit comprising:

a delay part delaying a signal by a delay time which is varied based on a control current; and a control current adjustment circuit adjusting the control current so that the delay time changes linearly based on a variation in a resistance value, wherein the control current adjustment circuit comprises:

a first resistance unit generating a first voltage; and a second resistance unit comprising a *second* variable resistor in which the resistance *value* of the *second* variable resistor varies stepwisely or discretely but linearly as a whole so that the control current adjusting circuit controls the *control* current based on the resistance value of the *second* variable resistor for generating a second voltage; and wherein the control current adjusting circuit controls the control current based on the first and second voltages;

the first resistance unit comprises a fixed resistor and a first variable resistor; and the second resistance unit comprises [a] *the* second variable resistor having a resistance value equal to that of the first variable resistor.

2. The delay circuit as claimed in claim 1, wherein the delay part comprises a logic *circuit* which delays the signal by the delay time in accordance with the control current.

3. The delay circuit as claimed in claim 1, wherein each of the first and second variable resistors [has] *are variable over a plurality of* discrete resistance values.

4. A delay circuit comprising:

a delay part delaying a signal by a delay time which is varied based on a control current; and a control current adjustment circuit adjusting the control current so that the delay time changes linearly based on a variation in a resistance value, wherein the control circuit adjustment circuit comprises:

a first resistance unit generating a first voltage, the first resistance unit comprising a first fixed resistor and a first variable resistor;

a second resistance unit generating a second voltage, the second resistance unit comprising a second variable resistor; and a control current controlling circuit controlling the control current based on the first and second voltages.

5. The delay circuit as claimed in claim 4, wherein [the] *each of the first and second variable resistors are* variable [resistor has] *over a plurality of* discrete resistance values.

6. A semiconductor device comprising:

a delay circuit delaying a given signal; and an internal circuit operating using a delayed given signal from the delay circuit, the delay circuit comprising:

a delay part delaying [a] *the given* signal by a delay time which [can be] *is* varied based on a control current; and a control current adjustment circuit adjusting the control current so that the delay time changes linearly based on a variation in a resistance value, wherein the control current adjustment circuit comprises:

a first resistance unit generating a first voltage; and a second resistance unit comprising a *second* variable resistor in which the resistance *value* of the *second* variable resistor varies stepwisely or discretely but linearly as a whole so that the control current [adiusting] *adjusting* circuit controls the control current based on the resistance value of the *second* variable resistor for generating a second voltage; and wherein the control current adjusting circuit controls the control current based on the first and second voltages;

the first resistance unit comprises a fixed resistor and a first [varable] *variable* resistor; and the second resistance unit comprises [a] *the* second variable resistor having a resistance value equal to that of the first variable resistor.

7. The semiconductor device as claimed in claim 6, wherein each of the first and second variable resistors [has] *are variable over a plurality of* discrete resistance values.

8. The [sermiconductor] *semiconductor* device as claimed in claim 6, wherein the delay part comprises a logic circuit which delays the *given* signal by the delay time in accordance with the control current.

9. A semiconductor device comprising:

a delay circuit delaying a given signal; and an internal circuit operating using a delayed given signal from the delay circuit, the delay circuit comprising:

a delay part delaying [a] *the given* signal by a delay time which [can be] *is* varied based on a control current; and a control current [adjustnent] *adjustment* circuit adjusting the control current so that the delay time changes linearly based on a variation in a resistance value, wherein the control current adjustment circuit comprises:

a first resistance unit generating a first voltage, the first resistance unit comprising a first fixed resistor and a first variable resistor;

a second resistance unit generating a second voltage, the second resistance unit comprising a second variable resistor; and a control current generating circuit generating the control current based on the first and second voltages.

10. The semiconductor device as claimed in claim 9, wherein [the variable resistor has] *each of the first and second variable resistors are variable over a plurality of* discrete resistance values.

11. The semiconductor device as claimed in claim 9, wherein the given signal is an external clock, and the internal circuit is a data input/output circuit.

* * * * *